(12) United States Patent
Mueller et al.

(10) Patent No.: US 8,716,812 B2
(45) Date of Patent: May 6, 2014

(54) INTERFACIAL LAYER REGROWTH CONTROL IN HIGH-K GATE STRUCTURE FOR FIELD EFFECT TRANSISTOR

(75) Inventors: Markus Mueller, Brussels (BE); Guillaume Boccardi, Leuven (BE); Jasmine Petry, Brussels (BE)

(73) Assignee: NXP B.V., Eindhoven (NL)

( * ) Notice: Subject to any disclaimer, the term of this patent is extended or adjusted under 35 U.S.C. 154(b) by 579 days.

(21) Appl. No.: 13/001,383

(22) PCT Filed: Jun. 24, 2009

(86) PCT No.: PCT/IB2009/052709
§ 371 (c)(1),
(2), (4) Date: Jan. 26, 2011

(87) PCT Pub. No.: WO2009/156954
PCT Pub. Date: Dec. 30, 2009

(65) Prior Publication Data
US 2013/0187241 A1   Jul. 25, 2013

(30) Foreign Application Priority Data
Jun. 25, 2008 (EP) .................... 08104543

(51) Int. Cl.
*H01L 21/02* (2006.01)
(52) U.S. Cl.
USPC ......................................... 257/410
(58) Field of Classification Search
USPC .......................................... 257/410
See application file for complete search history.

(56) References Cited

U.S. PATENT DOCUMENTS

| 5,936,287 A | 8/1999 | Gardner et al. |
| 6,703,277 B1 | 3/2004 | Paton et al. |
| 2004/0238904 A1 * | 12/2004 | Colombo et al. ............. 257/410 |
| 2005/0048746 A1 | 3/2005 | Wang |

FOREIGN PATENT DOCUMENTS

| EP | 1450395 A2 | 8/2004 |
| WO | 03/041124 A2 | 5/2003 |
| WO | 2009/133515 A1 | 11/2009 |

OTHER PUBLICATIONS

International Search Report and Written Opinion for Application PCT/IB2009/052709 (Sep. 10, 2009).

* cited by examiner

*Primary Examiner* — Marc Armand
*Assistant Examiner* — Steven Rao

(57) ABSTRACT

A field effect transistor having a gate structure comprising a high-K dielectric layer, a gate electrode located on the high-K dielectric layer, and an interfacial layer located in between the high-K dielectric layer and a channel region of the field effect transistor. The interfacial layer comprises a layer of $SiO_2$ containing a regrowth inhibiting agent. A method of forming the gate structure includes forming a gate stack comprising, in order: a $SiO_2$ layer adjacent a channel region of the field effect transistor; a high-K dielectric layer on the $SiO_2$ layer; and a gate electrode on the high-K dielectric layer. The method also includes introducing a regrowth inhibiting agent into the $SiO_2$ layer and then annealing the gate structure. The presence of the regrowth inhibiting agent in the $SiO_2$ interfacial layer inhibits regrowth of the $SiO_2$ layer into the channel region during the annealing step.

16 Claims, 3 Drawing Sheets

INTERFACIAL LAYER REGROWTH CONTROL IN HIGH-K GATE STRUCTURE FOR FIELD EFFECT TRANSISTOR

FIELD OF THE INVENTION

This invention relates to gate structures for field effect transistors. In particular, this invention relates to gate structures that include a high-K dielectric layer and an interfacial layer located in between the high-K dielectric and a channel region of the field effect transistor.

BACKGROUND OF THE INVENTION

The ever decreasing dimensions of semiconductor devices such as field effect transistors continue to present new challenges for gate design and manufacture. As gate lengths reduce, the thickness of the gate insulating layers that are used must also decrease. Conventionally, $SiO_2$ has been used as a gate insulator. However, since $SiO_2$ layers thinner than around 1.0-1.5 nm suffer from unacceptably strong gate leakage effects, attention in recent times has turned to alternative structures that include high-K dielectric materials.

High-K dielectric materials allow thicker insulating layer dimensions to be employed, while retaining relatively high values of gate capacitance.

As illustrated in FIG. 1, known high-K gate structures use a bi-layered arrangement comprising a dielectric layer 4 of high-K gate material and an interfacial layer 2, which is located in between high-K dielectric layer 4 and the channel region 6 of the field effect transistor 10. As shown in FIG. 1, the transistor 10 also includes conventional source and drain regions 12, located on either side of the channel region 6, in the substrate 14.

The purpose of the interfacial layer 2 shown in FIG. 1, which typically comprises a layer of relatively low-K $SiO_2$, is to act as a seed for the growth of the high-K dielectric layer 4 (which can be crystalline or amorphous) during manufacture. The gate electrode 8 itself is formed on top of the high-K dielectric layer 4. The gate electrode 8 may typically comprise a metal or polysilicon layer. Spacers 5 are typically provided on either side of the gate.

Present high-K gate technologies are unable to meet the demands of the International Technology Roadmap for Semiconductors (ITRS), which foresees an 8 Å CETinv (Capacitance Equivalent Thickness under inversion) for high performance applications in 2011 (this is equivalent to a standard oxide ($SiO_2$) thickness of 4-5 Å). In present high-K gate structures of the kind shown in FIG. 1, the interfacial layer 2 is typically formed with a thickness of 7-12 Å. Moreover, the high-K dielectric layer 4 thickness is limited by the fact that known high-K materials cannot at present be grown homogenously below a thickness of around 12-15 Å.

It is an object of this invention to address at least some of the limitations noted above in respect of existing gate structures incorporating high-K dielectrics.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

According to an aspect of the invention, there is provided a field effect transistor having a gate structure. The gate structure includes a high-K dielectric layer. The gate structure also includes a gate electrode located on the high-K dielectric layer. The gate structure further includes an interfacial layer located in between the high-K dielectric layer and a channel region of the field effect transistor. The interfacial layer comprises a layer of $SiO_2$ containing a regrowth inhibiting agent.

According to another aspect of the invention, there is provided a method of forming a gate structure of a field effect transistor. The method includes forming a gate stack comprising, in order: a $SiO_2$ layer adjacent a channel region of the field effect transistor; a high-K dielectric layer on the $SiO_2$ layer; and a gate electrode on the high-K dielectric layer. The method also includes introducing a regrowth inhibiting agent into the $SiO_2$ layer. The method further includes annealing the gate structure. The presence of the regrowth inhibiting agent in the $SiO_2$ layer inhibits regrowth of the $SiO_2$ layer into the channel region during the annealing step.

In accordance with this invention, it has been recognised that during the manufacture of a field effect transistor including a high-K gate structure, regrowth of the $SiO_2$ interfacial layer into the channel region of the transistor (during an anneal step), leads to an increased oxide thickness for the gate insulator. It is also recognised that by inhibiting regrowth of the interfacial layer during an annealing step of the manufacture process, the problem of reducing the overall thickness of the gate insulation provided in the gate structure (where the gate insulation thickness may be defined as the combined thickness of the interfacial layer and the high-K dielectric layer) can be at least partially addressed. It has further been recognised that regrowth of the interfacial layer can be achieved by introducing a regrowth inhibiting agent into the interfacial layer prior to any anneal processes that a performed as part of the larger manufacturing method.

In accordance with an embodiment of the invention, the regrowth inhibiting agent comprises impurity ions. In accordance with an embodiment of the invention, the regrowth inhibiting agent comprises impurity ions selected from the group consisting of As and P.

The addition of impurities such as As into the gate electrode (which may, for example, comprise a metal or polysilicon layer) has been found to produce an n-type tuning effect on the work function of the gate electrode. This tuning effect may itself be used to tailor the characteristics of the gate. However, if n-type tuning is not desired, then p-type dopants can be added to the gate electrode or an p-type metal gate can be used to compensate.

In one embodiment, the interfacial layer has a thickness in the range 3 to 12 Å.

In one embodiment, the high-K dielectric layer has a thickness in the range 1-3 nm.

In one embodiment, the high-K dielectric layer has a value of κ greater than 15. In particular, the high-K dielectric layer can have a value of κ in the range 15-25.

In one embodiment, the As or P impurity ions are present in a concentration of between ~$10^{18}$ and ~$10^{20}$ at/cm$^3$.

The field effect transistor can comprise, for example, a Metal Insulator Semiconductor Field Effect Transistor (MISFET), a Fin Field Effect Transistor (FinFET), or a Trench Field Effect Transistor (TrenchFET).

In accordance with an embodiment of the invention, the regrowth inhibiting agent can be introduced into the $SiO_2$ interfacial layer using ion beam implantation techniques. The implantation energy for As impurities can be in the range 6-8 keV, while the implantation energy for P impurities can be in the range 2-6 keV. A dosage level in the range $1\times10^{15}$ cm$^{-2}$ to $5\times10^{15}$ cm$^{-2}$ can be used, depending on the layer thicknesses and material densities of the gate electrode (typically 2-15 nm thick) and any cap layer that is provided (typically 5-10 nm thick) on the gate electrode. Alternative techniques to ion beam implantation (such as plasma doping (PLAD)) may also be used to introduce the regrowth inhibiting agent into the device.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide gate high-K structures having thinner gate insulation than could previously be achieved. In particular, it has been found that the interfacial layer, that typically forms a seed for the growth of a high-K dielectric layer, has a tendency to regrow into the channel region of a field effect transistor during any annealing steps that are carried out as part of the larger manufacturing process. It has further been found that this regrowth can be largely prevented by introducing a regrowth inhibiting agent into the interfacial layer prior to the performance of the annealing step or steps. Both As and P impurities introduced into the interfacial layer prior to an annealing step have been found to act as regrowth inhibitors.

In the following, the invention is described with reference to the gate structure of a bulk MISFET. However, it will be appreciated that the described embodiments are merely examples of how the invention may be implemented. In particular, it will be appreciated that a gate structure of the kind described herein may be provided for field effect transistors other than bulk MISFETs. For example, the invention may be applied to other forms of field effect transistor such as Fin-FETs and TrenchFETs.

Figure 1:
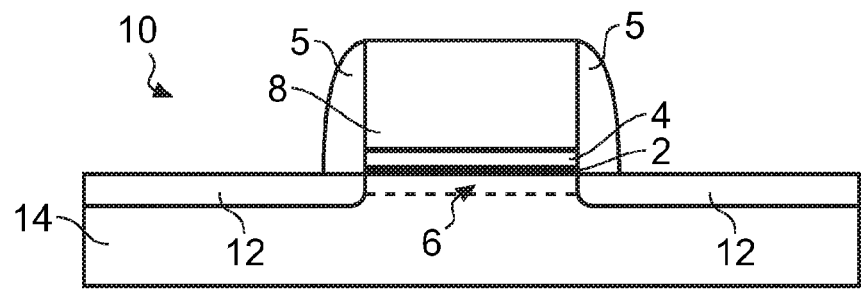
FIG. 1 shows an example of a known field effect transistor incorporating a high-K gate structure.
Figure 2:
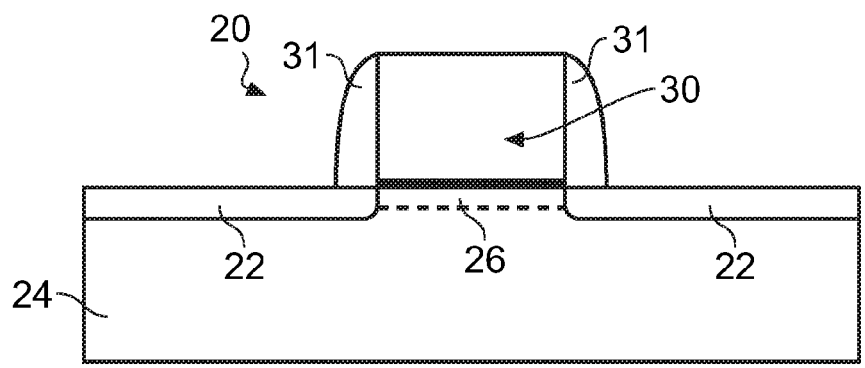
FIG. 2 shows an example of a field effect transistor in accordance with an embodiment of the invention.

An example of a field effect transistor incorporating a gate structure in accordance with an embodiment of this invention is illustrated schematically in FIG. 2. In this example, the field effect transistor 20 comprises a bulk MISFET such a MOSFET. The field effect transistor 20 includes source/drain regions 22 which are provided at the surface of a semiconductor substrate 24. Extending between the source/drain regions 22, there is a channel region 26 as is well known in conventional bulk MOSFET arrangements. Above the channel region 26, there is provided a gate structure 30. The gate structure 30 can be provided with spacers 31 on either side. As with conventional bulk MOSFETs, a potential applied above the channel region 26 through the gate structure 30 is used to control conduction between the source/drain regions 22 through the channel region 26.

Figure 3:
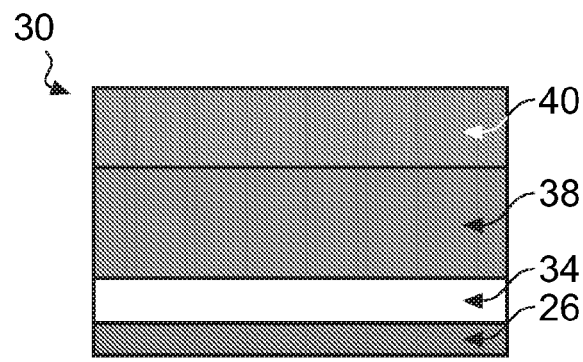
FIG. 3 shows an example of a gate structure for a field effect transistor in accordance with an embodiment of the invention.

FIG. 3 shows the gate structure 30 of the field effect transistor 20 in more detail. As can be seen in FIG. 3, the gate structure 30 is provided above the channel region 26 of the MOSFET. The gate structure 30 in this example includes an interfacial layer 34 that is formed on the surface of the semiconductor substrate 24 (see FIG. 2).

On an upper surface of the interfacial layer 34 there is provided a high-K dielectric layer 38. The purpose of the interfacial layer 34 is to act as a seed layer for the high-K dielectric layer 38. In accordance with an embodiment of the invention, the κ value of the material used in the high-K dielectric layer 34 is greater than 15. Examples of materials that may be used to form the high-K dielectric layer 38 include $HfO_2$, $ZrO_2$, $TiO_2$, $Ta_2O_5$, HfSiO, $La_2O_3$, $Y_2O_3$ and $Al_2O_3$. The high-K dielectric layer can, in some embodiments, comprise a stack of sub-layers, each comprising one or more of the high-K materials indicated above.

As described below, the interfacial layer 34 itself comprises $SiO_2$, into which a regrowth inhibiting agent has been introduced. Typically, the regrowth inhibiting agent may take the form of impurities such as ions of As or P. The concentration in which these impurities are present can be in the range ~$10^{18}$ and ~$10^{20}$ at/$cm^3$. After manufacture, the regrowth inhibiting agent remains within the interfacial layer. In accordance with an embodiment of the invention, the thickness of the interfacial layer 34 can be in the range 3 to 12 Å. The thickness of the high-K dielectric layer can be in the range 1 to 3 nm.

As shown in FIG. 3, above the gate insulation of the gate structure 30 (which consists of the interfacial layer 34 and the high-K dielectric layer 38), there is provided a gate electrode 40. Any suitable conventional material may be used for the purposes of the gate electrode 40. By way of example, the gate electrode may comprise polysilicon. Alternatively, the gate electrode 38 can comprise metals or metal compounds such as Mo, Ru, MoO, W, TiN, TaN, WN, MoN, TaC, TaCN, TaCNO, TaSi, HfSi, NiSi, with variable stoichiometries for each compound. Where the gate electrode 40 comprises a pure metal there can also be provided a Si cap layer.

An example method of making a gate structure of the kind described above with respect to FIGS. 2 and 3 will now be described in relation to FIGS. 4A to 4D.

Figure 4A:
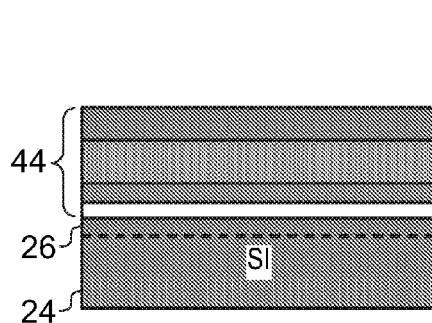
FIG. 4 illustrates the various stages in an example method for manufacturing a gate stack for a field effect transistor in accordance with an embodiment of the invention.

As is shown in FIG. 4A, the first stage in manufacturing a gate structure in accordance with this example comprises forming a gate stack 44 on the surface of a semiconductor substrate 24. The relative order of the steps for manufacturing the remaining features of the field effect transistor is not essential to this invention. In particular, the source/drain regions of the field effect transistor may either be formed prior to or subsequent to the formation of the gate stack, in accordance with the design requirements of the processing required.

The gate stack 44 itself includes a number of layers as shown in FIG. 4A. On the surface of the semiconductor substrate 24, above the channel region 26 of the field effect transistor, there is provided a $SiO_2$-based layer 33. This layer may be formed in a number of ways. Typically, the layer 33 may be formed by oxidising (e.g. using a thermal or chemical oxidisation step) the surface of a silicon semiconductor substrate 24. Above the $SiO_2$ layer 33 there is provided a high-K dielectric layer 38 of the kind described above. The high-K dielectric layer 38 can be formed above the layer 33 by depositing a high-K dielectric material in a conventional manner (e.g. by Atomic Layer Deposition (ALD), Metal-Organic Chemical Vapour Deposition (MOCVD) or Physical Vapour Deposition (PVD)). Similarly, conventional techniques (e.g. ALD, CVD, MOCVD or PVD) can be used to provide the gate electrode material 40 above the high-K dielectric layer 38 and the optional capping layer 42 above the gate electrode material 40. Conventional techniques (such as masking and etching steps) can be employed to pattern the gate stack 44. Typical thicknesses for the layers in the gate stack 44 are as follows:

SiO$_2$ interfacial layer 33=3-12 Å;
high-K dielectric layer 38=1-3 nm;
gate electrode material 40=2-15 nm;
capping layer 42=5-20 Å.

Figure 4B:
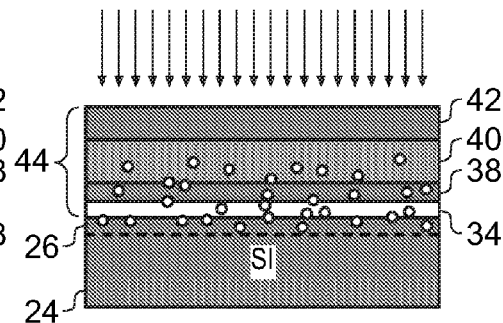

The next stage in the method of making the new gate structure in accordance with this invention is shown FIG. 4B. After formation of the gate stack 44 as described above, a regrowth inhibiting agent is introduced into the SiO$_2$-based layer 33.

Any suitable method for introducing the regrowth inhibiting agent into the layer 33 can be used. The actual method used may be tailored according the particular form the regrowth inhibiting agent takes. As described herein, and in accordance with an embodiment of this invention, the regrowth inhibiting agent can take the form of impurity ions. By way of example only, it has been shown that both As and P ions introduced into the SiO$_2$ interfacial layer 33, can act to inhibit regrowth of the interfacial layer 33 during subsequent annealing.

In the present example, and as show in FIG. 4B, an ion implantation step is used to introduce As and/or P into the interfacial layer 33. In accordance with this example, a beam of As and/or P ions is directed down through an upper surface of the gate stack 44 with sufficient energy to reach the layer 33, whereby an interfacial layer 34 including at least some As and/or P ions is formed. Typical implantation energies that may be used to implant the ions lie within the range 6 to 8 keV in the case of As ions and 2 to 6 keV in the case of P ions. The dosage level for the ion implantation step can lie in the range $1\times10^{15}$ cm$^{-2}$ to $5\times10^{15}$ cm$^{-2}$. As an alternative method for introducing the As and/or P ions into the layer 33, a plasma doping (PLAD) step may be used.

Following the introduction of the regrowth inhibiting agent into the SiO$_2$ interfacial layer 33 to form an interfacial layer 34 which includes the agent, the interfacial layer 34 is secured against regrowth into the channel region 26. During regrowth of this kind, a SiO$_2$ interfacial layer (i.e. without any kind of inhibiting agent as described herein) may otherwise typically expand to consume a few Angstroms (e.g. 1-5 Å) of Si in the channel region 26 beneath the gate stack 44.

The annealing step(s) may be associated with dopant activation in the source/drain regions 22 of the transistor 20. However, it should also be noted that the annealing step(s) described herein need not necessarily be directly associated with the manufacture of the field effect transistor 20 itself. Instead, the subsequent annealing step(s) may be associated primarily with the manufacture of other components on the wafer on which the transistor 20 is formed.

The heating step(s) themselves can comprise parameters which fall within standard CMOS annealing conditions. By way of an example, the heating step(s) can comprise heating the field effect transistor to a temperature in the range 600-1100° C. for a duration of between is (for highest temperatures) to several minutes (for lowest anneal temperatures).

Figure 4C:
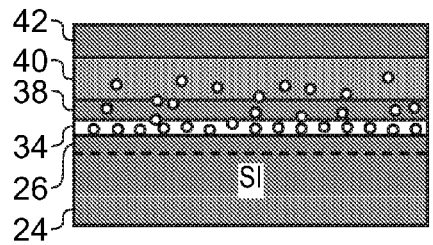

Following the performance of one or more annealing steps, a gate structure of the kind illustrated in FIG. 4C is produced. It can be seen in FIG. 4C that the implanted impurity ions have redistributed within the gate stack 44 and channel region 26 as a result of the heating step(s). In particular, and in accordance with an embodiment of the invention, the impurity ions have a tendency to diffuse out of the channel region 26 and back into the gate stack 44. This can cause an increased concentration of impurity ions in the interfacial layer 34, particularly near the interface between the interfacial layer and the surface of the substrate 24. This diffusion of impurity ions from the channel region 26 back into the gate stack 44, and the build up of impurity ions within the interfacial layer 34 is thought to be related to the inhibition of regrowth by the interfacial layer 34 into the channel region 26.

Figure 4D:
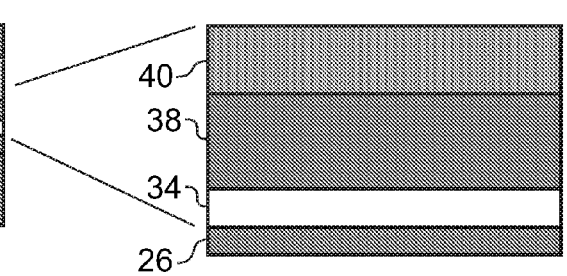
Figure 4E:
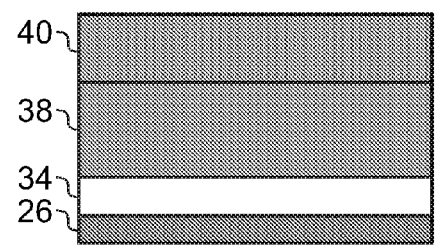

FIG. 4D schematically illustrates the finished gate stack 44, including the interfacial layer 34 located over the channel region 26, the high-K dielectric layer 38 above the interfacial layer 34, and the electrode 40 provided on the high-K dielectric layer 38. FIG. 4E schematically shows a gate stack that has been produced without the inclusion of a regrowth inhibiting agent in the interfacial layer 34. As can be seen by comparing FIGS. 4D and 4E, without the inclusion of the regrowth inhibiting agent, the interfacial layer 34 tends to expand into the channel region 26 during manufacture—the interfacial layer 34 in FIG. 4E is substantially larger than the interfacial layer shown in FIG. 4D.

An effect of the introduction of impurity ions such as As into the gate stack 44 described in relation to FIGS. 3 and 4 above, is that n-type tuning of the gate electrode material 40 can occur. This effect may actually prove to be useful for tuning the work function of the gate electrode. However, if tuning of this kind is not desired, then p-type dopants can be added to the gate electrode layer 40 to compensate for the n-type tuning of the As. Alternatively, the gate electrode material itself may be chosen to be an p-type metal (e.g. MoN, W, WN), upon which the introduction of small amounts of As would have little effect.

Figure 5:
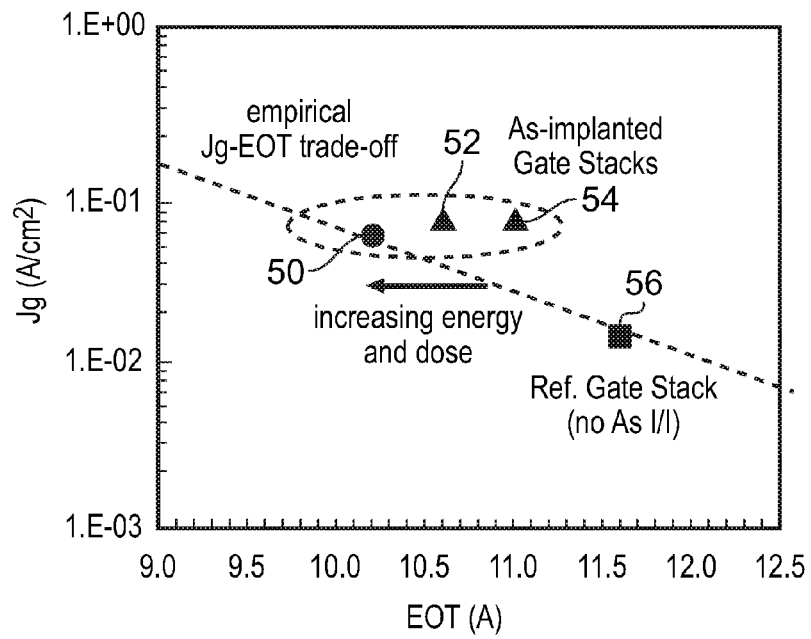
FIG. 5 shows the result of a trial that has been performed to investigate the effect of As introduction into a high-K gate structure.

FIG. 5 shows the result of a trial that has been performed to investigate the effect of As introduction into a high-K gate structure using a method of the kind described above in relation to FIG. 4.

The trend line shown in FIG. 5 indicates the gate leakage trade-off for a given interfacial layer and high-K dielectric layer (in the data shown in FIG. 5, this comprises a HfO$_2$ high-K dielectric layer on a SiO$_2$ interfacial layer). The trend line illustrates that for a given gate interfacial layer and high-K dielectric layer, a reduction in effective oxide thickness generally results in an increase in gate leakage current J$_g$.

The gate stacks used in the trial comprised a 10 nm a-Si cap layer provided on a 10 nm TiN gate electrode, and a 2 nm HfO$_2$ High-K dielectric layer provided on a SiO$_2$ interfacial layer having a thickness of approximately 1 nm. As described herein, As impurities were introduced into three separate gate stacks using ion implantation. The leakage current and effective oxide thickness of each resulting gate stack were then measured.

The implant parameters for the data points in FIG. 5 were as follows:

| Data point | Implant energy (keV) | Dose (cm$^{-2}$) |
| --- | --- | --- |
| 50 | 8 | 2E15 |
| 52 | 6 | 4E15 |
| 54 | 6 | 2E15 |

Additionally, data point 56 in FIG. 5 represents a further such gate stack, into which no As was introduced. As can be seen from FIG. 5, a reduction of between 0.5 Å and 1.5 Å in effective oxide thickness (EOT) was achieved in the gate stacks into which As was implanted, as compared to the gate stack into which no As was implanted.

Figure 6:
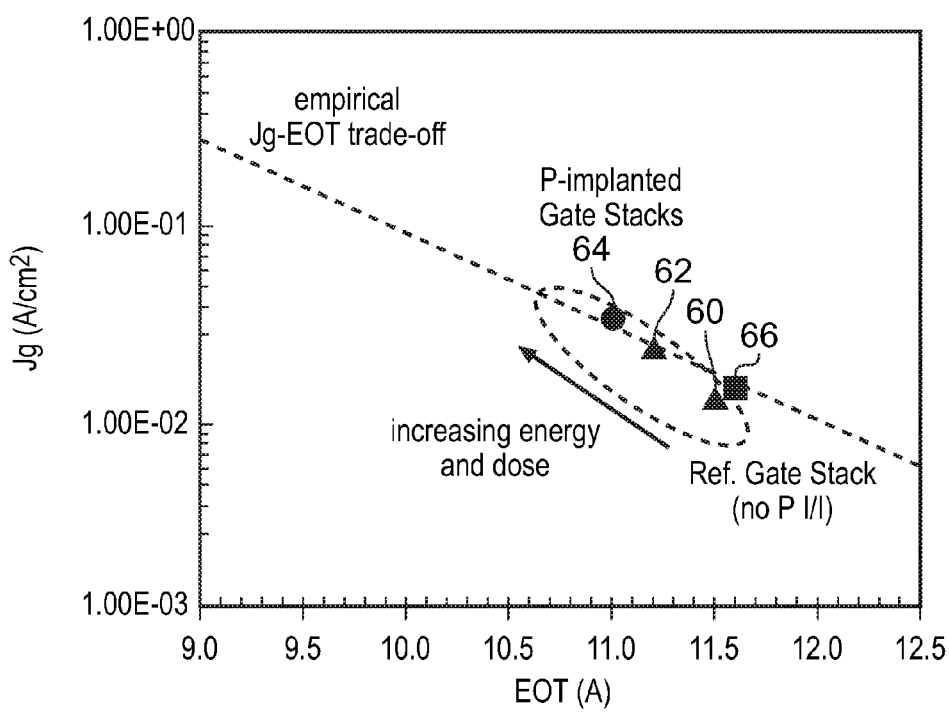
FIG. 6 shows the result of a trial that has been performed to investigate the effect of P introduction into a high-K gate structure.

FIG. 6 shows the result of a trial that has been performed to investigate the effect of P introduction into a high-K gate structure using a method of the kind described above in relation to FIG. 4.

The trend line shown in FIG. 6 indicates the gate leakage trade-off for a given interfacial layer and high-K dielectric layer (in the data shown in FIG. 6, this comprises a $HfO_2$ high-K dielectric layer on a $SiO_2$ interfacial layer). As with FIG. 5, the trend line demonstrates that for a given gate interfacial layer and high-K dielectric layer, a reduction in effective oxide thickness generally results in an increase in gate leakage current $J_g$.

The gate stacks used in the trial comprised a 10 nm a-Si cap layer provided on a 10 nm TiN gate electrode, and a 2 nm $HfO_2$ High-K dielectric layer provided on a $SiO_2$ interfacial layer having a thickness of approximately 1 nm. As described herein, P impurities were introduced into three separate gate stacks using ion implantation. The leakage current and effective oxide thickness of each resulting gate stack were then measured.

The implant parameters for the data points in FIG. 6 were as follows:

| Data point | Implant energy (keV) | Dose (cm$^{-2}$) |
| --- | --- | --- |
| 60 | 2 | 2E15 |
| 62 | 2 | 4E15 |
| 64 | 4 | 2E15 |

Additionally, data point 66 in FIG. 6 represents a further such gate stack, in which no P was introduced. As can be seen from FIG. 6, a reduction of up to about 0.5 Å in EOT was achieved in the gate stacks into which P was implanted, as compared to the gate stack into which no P was implanted.

Accordingly, there has been described a field effect transistor having a gate structure comprising a high-K dielectric layer, a gate electrode located on the high-K dielectric layer, and an interfacial layer located in between the high-K dielectric layer and a channel region of the field effect transistor. The interfacial layer comprises a layer of $SiO_2$ containing a regrowth inhibiting agent. A method of forming the gate structure includes forming a gate stack comprising, in order: a $SiO_2$ layer adjacent a channel region of the field effect transistor; a high-K dielectric layer on the $SiO_2$ layer; and a gate electrode on the high-K dielectric layer. The method also includes introducing a regrowth inhibiting agent into the $SiO_2$ layer and then annealing the gate structure. The presence of the regrowth inhibiting agent in the $SiO_2$ interfacial layer inhibits regrowth of the $SiO_2$ layer into the channel region during the annealing step.

Although particular embodiments of the invention have been described, it will be appreciated that many modifications/additions and/or substitutions may be made within the scope of the claimed invention.

The invention claimed is:

1. A field effect FET transistor having a gate structure comprising:
   a high-K dielectric layer;
   a gate electrode located on the high-K dielectric layer; and
   an interfacial layer located in between the high-K dielectric layer and a channel region of the field effect transistor, wherein the interfacial layer comprises a layer of $SiO_2$ containing a regrowth inhibiting agent, the interfacial layer including an amount of the regrowth inhibiting agent sufficient to inhibit regrowth of the $SiO_2$ layer into the channel region of the FET during annealing, thereby maintaining a predetermined thickness of the gate structure.

2. The field effect transistor of claim 1, wherein the gate electrode has a work function and the work function is tuned by p-type dopants or p-type metal.

3. The field effect transistor of claim 1, wherein the interfacial layer has a thickness in the range of about 3 Å to about 12 Å.

4. The field effect transistor of claim 1, wherein the high-K dielectric layer has a thickness in the range of about 1 nm to about 3 nm.

5. The field effect transistor of claim 1, wherein the high-K dielectric layer has a value of K greater than 15.

6. The field effect transistor of any preceding claim, wherein the regrowth inhibiting agent comprises impurity ions selected from the group consisting of As and P.

7. The field effect transistor of claim 6, wherein the As or P impurity ions are present in a concentration of between ~$10^{18}$ at/cm$^3$ and ~$10^{20}$ at/cm$^3$.

8. The field effect transistor of claim 1, wherein the field effect transistor comprises a MISFET, a FinFET, or a TrenchFET.

9. A method of forming a gate structure of a field effect transistor (FET), the method comprising:
   forming a gate stack including, in order:
      a $SiO_2$ interfacial layer adjacent a channel region of the field effect transistor;
      a high-K dielectric layer on the $SiO_2$ interfacial layer; and
      a gate electrode on the high-K dielectric layer;
   introducing a regrowth inhibiting agent of a sufficient amount into the $SiO_2$ interfacial layer; and
   annealing the gate structure,
wherein the regrowth inhibiting agent inhibits regrowth of said $SiO_2$ interfacial layer into the channel region during said annealing, thereby maintaining a predetermined thickness of the gate structure.

10. The method of claim 9 comprising introducing said regrowth inhibiting agent into the $SiO_2$ layer using ion implantation.

11. The method of claim 9, comprising introducing said regrowth inhibiting agent into the $SiO_2$ layer using plasma doping (PLAD).

12. The method of claim 9, wherein the regrowth inhibiting agent comprises impurity ions selected from the group consisting of As and P.

13. The method of claim 12, comprising introducing As impurities into the $SiO_2$ layer using ion implantation with an implantation energy in the range of about 6 keV to about 8 keV.

14. The method of claim 12, comprising introducing P impurities into the $SiO_2$ layer using ion implantation with an implantation energy in the range of about 2 keV to about 6 keV.

15. The method of claim 13, wherein the ion implantation is performed with a dosage level in the range of about $1 \times 10^{15}$ cm$^{-2}$ to about $5 \times 10^{15}$ cm$^{-2}$.

16. The method of claim 9, comprising forming said gate structure on a MISFET, a FinFET, or a TrenchFET.

* * * * *